United States Patent [19]
Koike

[11] Patent Number: 5,382,796
[45] Date of Patent: Jan. 17, 1995

[54] APPARATUS FOR MORPHOLOGICAL OBSERVATION OF A SAMPLE

[75] Inventor: Hirotami Koike, Tokyo, Japan

[73] Assignee: Kabushiki Kaisha TOPCON, Tokyo, Japan

[21] Appl. No.: 65,270

[22] Filed: May 21, 1993

[30] Foreign Application Priority Data

May 22, 1992 [JP] Japan .................................. 4-130966

[51] Int. Cl.⁶ .......................................... H01J 37/256
[52] U.S. Cl. ................................... 250/310; 250/397
[58] Field of Search ........................ 250/310, 397, 311

[56] References Cited

U.S. PATENT DOCUMENTS 4,041,311 8/1977 Martin ................................. 250/310
4,146,788 3/1979 Mirkin et al. ....................... 250/310
4,560,872 12/1985 Antonovsky ....................... 250/310

Primary Examiner—Paul M. Dzierzynski
Assistant Examiner—Kiet T. Nguyen
Attorney, Agent, or Firm—Finnegan, Henderson, Farabow, Garrett & Dunner

[57] ABSTRACT

The present invention aims at providing an apparatus for morphological observation of a sample or easily identifying a luminous part of a sample. This morphological observation apparatus comprises an illumination system 3 for bombarding charged particles to a sample, a photon detector system for receiving light generated from a luminous part of the sample due to illumination of the charged particles, a photomultiplier tube 7 for detecting electrons coming from various parts of the sample upon illumination of the charged particles in such various ways as to correspond to a surface structure of the sample, and a signal processing unit for superimposing morphological signal, in which a morphological image of the sample 5 and an image of the luminous part are superimposed one upon the other, in accordance with a signal of the photon detector system 9 and a detection signal of a photomultiplier tube 7, and a television monitor 19 for displaying the luminous part of the sample 5 and the morphological image in a superimposed condition relative to each other in accordance with the superimposed signal.

3 Claims, 3 Drawing Sheets

APPARATUS FOR MORPHOLOGICAL OBSERVATION OF A SAMPLE

BACKGROUND OF THE INVENTION

1. Field of the Invention

This invention relates to an improvement of an apparatus for morphological observation of a sample, such as a scanning electron microscope (SEM) or the transmission electron microscope (TEM).

2. Prior Art

Heretofore, there have been known apparatus for observing the surface structure of a sample, such as a scanning electron microscope or a transmission electron microscope. For example, the scanning electron microscope scans an electron beam on a sample surface. The scanning electron microscope detects a secondary electron or a backscattered electron. The apparatus for morphological observation of a sample as the scanning electron microscope forms dark and bright morphological image signals (shading image signals) in accordance with detection signals of the electron detector. The morphological image is indicative of that of the sample.

When bombarded with the electron ray, some samples are stimulated at a particular part thereof to emit a photoluminescence. There is also known an apparatus for morphological observation a sample of a scanning electron microscope which receives a photoluminescence stimulated by an electron ray irradiated to a sample and displays the illuminated part (i.e., stimulated part) of the sample in color.

As shown in FIGS. 4 and 5, in the conventional apparatus for morphological observation of a sample of the scanning electron microscope of this type, a morphological image 1 obtained by bombarding charged particles and a color image 2 obtained by a photoluminescence are separately taken in photographs, and the morphological image 1 and the color image 2 are placed side by side for comparison in order to identify the illumination part of the sample. FIG. 4 shows a morphological image of a mitochondria, and FIG. 5 shows a luminous part thereof.

Therefore, it is difficult to obtain a corresponding relation between each part of the morphological image 1 of the sample and the luminous part of the sample in such cases that the morphological image 1 is complicated in shape and the photo-luminescence is faint. Particularly, if the power is increased when the sample is a biological material, the chemical bond of polymer is disconnected by bombardment with the electron ray and as a result, discoloration occurs. Moreover, the photoluminescence becomes extremely faint, and the luminous area is difficult to be identified.

SUMMARY OF THE INVENTION

It is therefore an object of the present invention to provide an apparatus for morphological observation of a sample capable of easily identifying a luminous part of a sample.

To achieve the above object, an apparatus for morphological observation a sample according to the present invention comprises an illumination system for bombarding a sample with charged particles;

a photon detection system for detecting cathodluminescence emitted from a luminous part of said sample due to bombardment with said charged particles;

an electron detector for detecting electrons coming from various parts of said sample surface upon bombardment with the charged particles; and a signal processing unit for superimposing the said morphological signal coming from the said electron detector, and a signal of said luminous part through the said photon detection system, in accordance with a signal of said photon detection system and a detection signal of said electron detector, and an display unit for displaying said luminous part of said sample and said morphological image in a superimposed condition relative to each other in accordance with said superimposed signal.

According to the morphological observation apparatus of the present invention, the illumination system illuminates charged particles. Each part of the sample is scanned by the charged particles. The electron detector detects electrons coming from various parts of the sample surface upon bombardment with the charged particles. The luminous part of the sample is illuminated by irradiation of the charged particles. The photon detection system detects cathodluminescence from the luminous part. The signal pocessing units forms a superimposed morphological signal coming from the said electron detector and an signal of the luminous part through the said cathodluminescence upon photon detector. The display unit displays the morphological image and the luminous part in a superimposed condition relative to each other in accordance with the superimposed signal.

Since the morphological observation apparatus according to the present invention displays the luminous part superimposed on the white and black morphological image, the luminous part can be identified easily.

DESCRIPTION OF THE PREFERRED EMBODIMENTS

Figure 1:
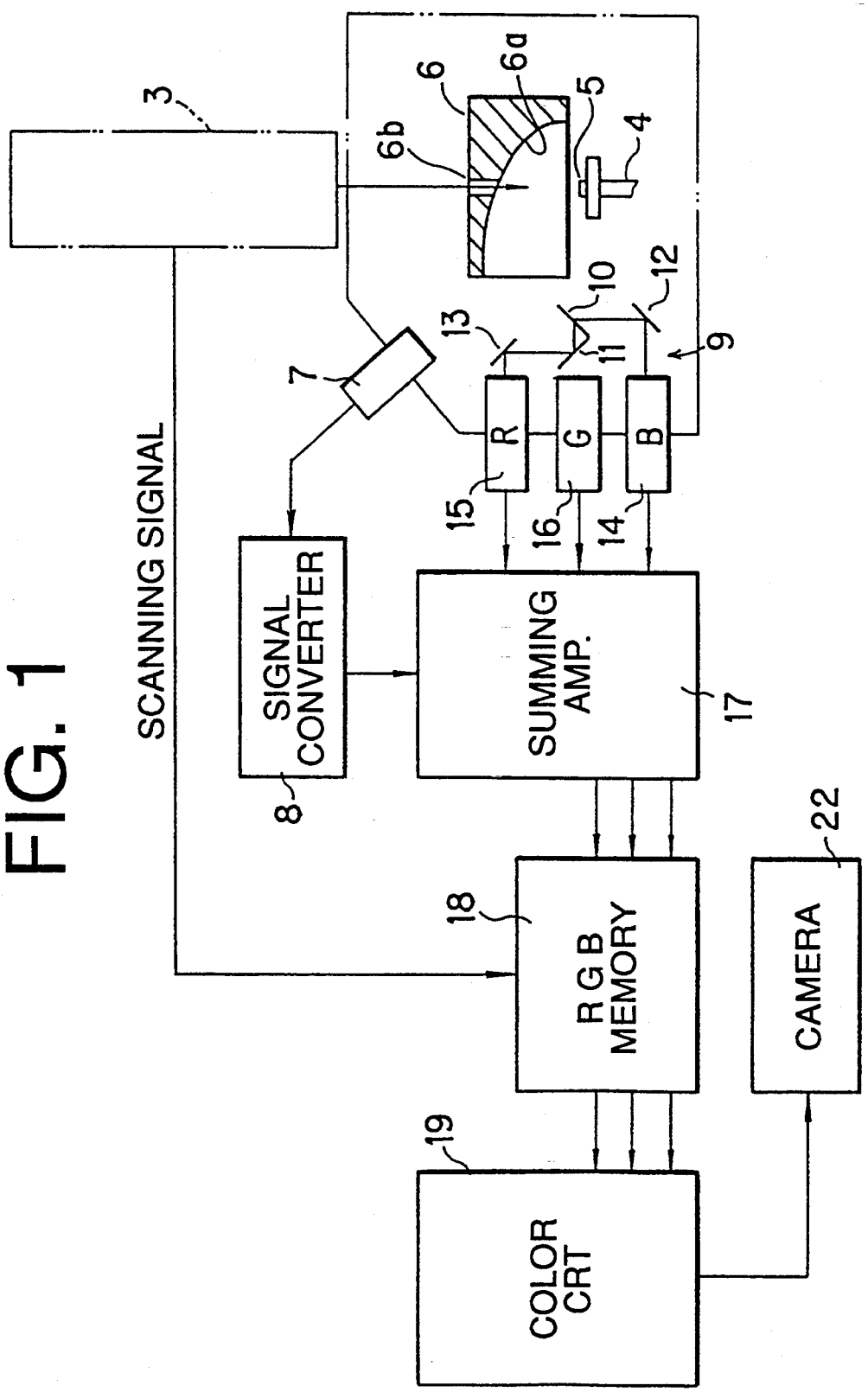
FIG. 1 shows a first embodiment of a morphological observation apparatus according to the present invention applied to a scanning electron microscope.

In FIG. 1, reference numeral 3 denotes an illumination of a scanning electron microscope. This illumination system 3 includes an electron gun, a focusing lens, a scanning coil, and an objective lens (all not shown) known per se. A sample stage 4 is disposed at a lower part of the illumination system 3. The sample stage 4 is adjustable in position relative to the illumination system 3. A cutting-piece of a sample 5 such as a semiconductor, a compound, or a biological coil is to be placed on the sample stage 4. Here, a mitochondria or a biological cell is placed on the sample stage 4 as the sample 5. One ellipsoidal mirror 6 is provided between the sample 4 and the illumination system 3. Reference number 6a denotes a reflection surface of the ellipsoidal mirror 6. This ellipsoidal mirror 6 has a through-hole 6b as an electron ray transmission portion. The electron ray as charged particles is contracted narrow so as to be able to pass through the through-hole 6b. Each part of the cutting piece of the sample 5 is scanned by the electron ray. Irradiated by the electron ray, the sample 5 discharges secondary electrons. Some of the scanning electron microscopes are of the type capable of detecting electrons which are backscattered by each part (each scanning point) of the sample 5 upon bombarding of the electron ray. In the case of a transmission electron microscope. It suffices that the electrons transmitted are detected.

The secondary electrons are detected by a photomultiplier tube 7 as an electron detector and amplified. In the case where the secondary electrons are faint, a photo counting photomultiplier tube is used as the electron detector. The secondary electrons are changed in generating amount in such a manner as to correspond to each part of the sample. The secondary electrons are once converted to light and amplified by the photomultiplier tube 7 so as to be converted to electrons again.

The detection signal of the photomultiplier tube 7 is inputted into a signal converter 8 through a pre amplifier (not shown). The signal converter 8 forms a morphological image signal (corresponding to a brightness signal of a television) as a signal indicative of dark and bright, in accordance with the detection signal from the detector. An image indicative of a for of the sample 5 can be obtained by the morphological image signal form the signal converter 8.

A certain part of the sample 5 is bombarded with the electron ray. A cathode-luminescence (CL) is emitted from this luminous part. The ellipsoidal mirror 6 has a role for collecting the cathode-luminescence. The cutting-piece of the sample 5 is in a location where one focal position of the ellipsoidal mirror 6 resides. The cathode-luminescence is reflected by the reflection surface 6a of the ellipsoidal mirror 6 and received by a photon detector system 9. The photon detector system 9 comprises dichroic mirrors 10 and 11 as a color-separation optical system for separating the cathode-luminescence in color, total reflection mirrors 12 and 13, and photomultiplier tubes 14, 15 and 16. The dichroic mirror 10 reflects a blue-color light (B-light) including an ultraviolet ray and transmits a red-color light (R-light) including a near infrared ray as well as a green-color light (G light). The dichroic mirror 11 reflects a red-color including a near infrared ray and transmit a green-color light.

The blue-color light reflected by the dichroic mirror 10 is reflected by the total reflection mirror 12 and guided to the photomultiplier tube 14. The red-color light reflected by the dichroic mirror 11 is reflected by the total reflection mirror 13 and guided to the photomultiplier tube 15. The green-color light transmitted through the dichroic mirrors 10 and 11 is guided to the photomultiplier tube 16. Each light receiving surface of the photomultiplier tubes 14, 15 and 16 is in place equivalent to the other focal position of the ellipsoidal mirror 6. The photomultiplier tubes 14, 15 and 16 increase and output color separation signals of B, R and G, respectively, in such a manner as to correspond to the ratio of colors included in the cathode-luminescence. The color separation signals of R, G and B and the morphological image signal from the signal converter 8 are inputted into an adder 17. The adder 17 adds up the color separation signals of R, B and G simultaneously obtained (obtained at a simultaneous scanning timing) in the respective parts under scanning (respective scanning points), and the morphological image signal from the signal converter 8. By doing this, superimposed image signals of R, G and B at the respective parts (respective scanning parts) are formed. The respective superimposed image signals at the respective parts (respective scanning parts) are inputted into a memory unit 18. The memory unit 18 stores the superimposed image signal of the red color, the superimposed image signal of the blue color and the superimposed image signal of the green color for one field. This is an image information for one frame. The superimposed image signal of the red color, the superimposed image signal of the blue color and the superimposed image signal of the green color all for one frame are inputted into a color monitor 19. The color monitor 19 has a role for functioning as a morphological image formation portion of the sample. On the image surface of the color monitor 10, the luminous part of the morphological image is chromatic and displayed in such a manner as to be superimposed on the part corresponding to its shading morphological image. As a result, it can be clearly known which portion of the respective parts of the sample is illuminated.

Figure 2:
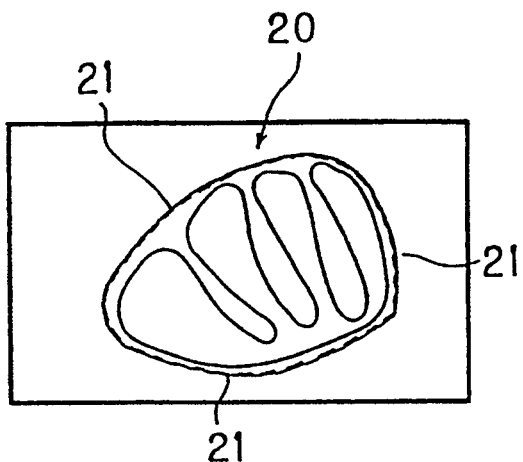
FIG. 2 shows a morphological image and a luminous part in a superimposed condition relative to each other.
Figure 4:
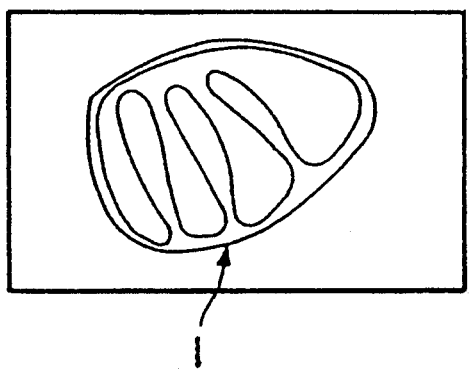
FIG. 4 shows a displaying condition of a morphological image according to the prior art.
Figure 5:
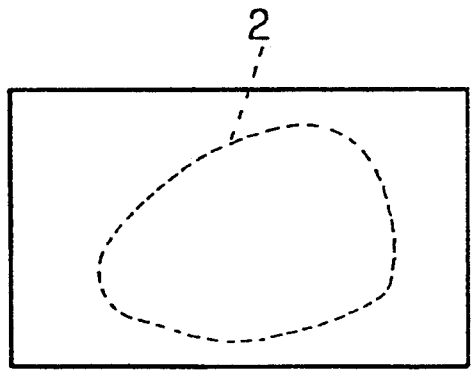
FIG. 5 shows a displaying condition of a luminous part of a sample according to the prior art.

FIG. 2 shows a mitochondria 20 as the morphological image which is displayed on the color monitor 19, and reference number 21 denotes a luminous part of the mitochondria. As shown in FIG. 2, of an inner wall and an outer wall of a cell membrane, it can easily identify that the outer wall illuminates. The morphological image displayed on the color monitor 19 can be taken in color by a camera 22 in accordance with necessity.

In this embodiment, the photoluminescence is collected using only one ellipsoidal mirror 6, so that the light quantity of the photoluminescence is effectively collected. As conventionally known, however, it may be arranged such that three ellipsoidal mirrors are placed at every 120 degrees and the photoluminescence is collected from three directions in order to form the respective color separation signals of R, G and B. According to this conventional arrangement, the area of the reflecting surface of the ellipsoidal mirror is smaller than that of this embodiment, less of the collecting light quantity becomes larger compared with this embodiment. However, as long as the present invention is concerned, this point is not substantial.

In this embodiment, the morphological image signal from the signal converter 8 and the respective color separation signals of R, G and B from the photodetector system 9 are added up first, and the respective superimposed image signals for one image surface portion are stored in the memory unit 18. However, it may be arranged such that the morphological image signal for one field is stored in the memory unit 18 first, and then the respective color separation signals of R, G and B are added up. The color separation optical system may comprise a band-pass filter instead of the dichroic mirror.

Figure 3:
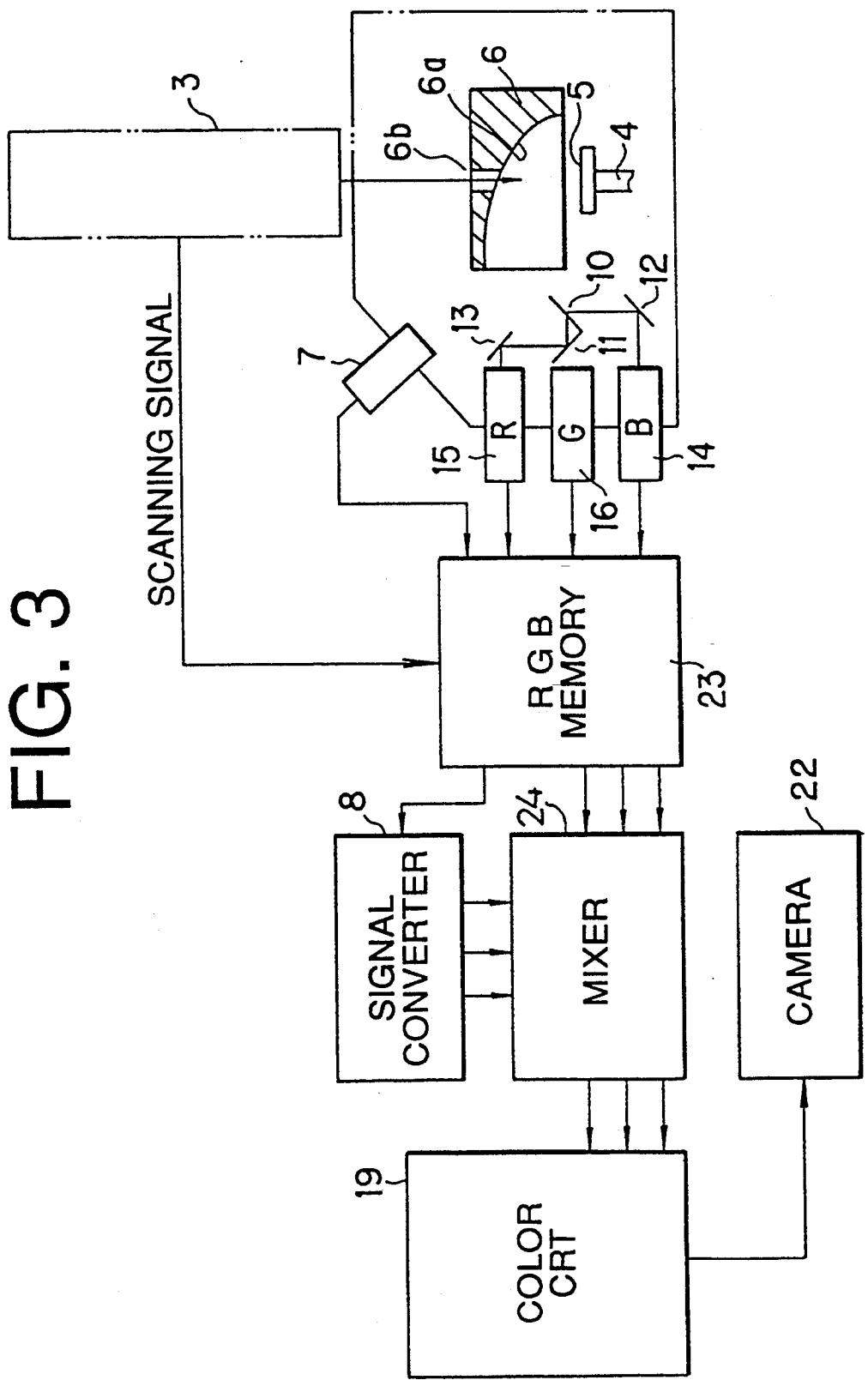
FIG. 3 shows a second embodiment of a morphological observation apparatus according to the present invention applied to a scanning electron microscope.

FIG. 3 shows a second embodiment of a morphological observation apparatus according to the present invention. Like component elements of the first embodiment are denoted by like reference numerals.

In this embodiment, the detection signal from the electron detector and the respective color separation signals of R, G and B from the photon detector system 9 are inputted into a memory unit 23 first. The memory unit 23 stores the detection signal from the electron detector and the respective color separation signals from the photon detector system 7 for one field. The detection signal for one field stored in the memory unit 23 is gradually read and inputted into the signal converter 8. The signal converter 8 forms a morphological image signal indicative of darkness and brightness of the same sample of the first embodiment. This morphological image signal is inputted into a mixer 24. The respective color separation signals for one image surface stored in the memory unit 23 are simultaneously inputted into the mixer 24 in such a manner as to correspond to the various parts of the sample 5. The mixer 24 mixes the morphological image signal and the respective color separation signals for each other in each pixcel in order to embody a super imposed color image (each scanning point).

Here, the mixer 24 makes the addition regarding the level of the morphological image signal at the part corresponding to the luminous part when the output level of each color separation signal in each luminous portion (or the output level of the morphological image signal at the part corresponding to the luminous part) is a predetermined level or higher, or superimposes lowering the level of the morphological image signal at the part corresponding to the luminous part. By doing this, a superimposed image signal of the red color for one image screen (or one frame), a superimposed image signal of the blue color for one image surface, and a superimposed image signal of the green color for one image surface are formed.

According to this second embodiment, the luminous part can be easily identified even when the photoluminescence of the luminous part of the sample is faint and the level of the morphological image signal or the part of the morphological image corresponding to the luminous part is high. Particularly, the luminous part can be easily identified in the vicinity of the contour of the morphological image.

In the above embodiment, the present invention is applied to a scanning electron microscope. However, the form observation apparatus according to the present invention is likewise applicable to other apparatuses such as a transmission electron microscope and ones in which the charged electrons are served as a probe.

What is claimed is:

1. An apparatus for morphological observing of a sample comprising:

an illumination system for bombarding said sample with charged particles;

a photon detection system for detecting cathodoluminescence emitted from a part of said sample due to bombardment with said charged particles;

an electron detector for detecting electrons from said part of said sample surface upon bombardment with the charged particles; and a signal processing unit for superimposing a morphological image signal from said electron detector, and a cathodoluminescence signal from said photon detection system, and a display unit for displaying a cathodoluminescence image and a morphological image of said part of said sample in a superimposed condition relative to each other in accordance with said superimposed signal.

2. An apparatus for morphological observation of a sample as claimed in claim 1, wherein said photon detection system includes an optical color separator for dividing said cathodoluminescence into three primary colors, said signal processing unit provided with a signal converter for forming said morphological image signal in accordance with said electrons detected by said electron detector in order to distinguishably display the morphological image of said sample in achromatic color and the cathodoluminescence image in chromatic color, said signal processing unit adding or mixing said morphological image signal and said cathodoluminescence image signal in order to form a superimposed image signal for one image surface per each color.

3. An apparatus for morphological observation of a sample as claimed in claim 1, wherein said photon detection system includes an optical color separator for dividing said cathodoluminescence into three primary colors, said signal processing unit provided with a signal converter for forming a morphological image signal in accordance with said electrons detected by said electron detector in order to distinguishably display the morphological image of said sample in achromatic color and the cathodoluminescence image in chromatic color, said signal processing unit summing or mixing said morphological image signal and said cathodoluminescence image signal in each pixel in order to form a superimposed color image.

* * * * *